(12) United States Patent
Ahn et al.

(10) Patent No.: US 10,629,471 B2
(45) Date of Patent: Apr. 21, 2020

(54) MICRO LED GRIP BODY

(71) Applicant: POINT ENGINEERING CO., LTD., Asan (KR)

(72) Inventors: Bum Mo Ahn, Suwon (KR); Seung Ho Park, Hwaseong (KR); Dong Hyeok Seo, Asan (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/414,347

(22) Filed: May 16, 2019

(65) Prior Publication Data

US 2019/0355610 A1 Nov. 21, 2019

(30) Foreign Application Priority Data

May 16, 2018 (KR) ........................ 10-2018-0056023

(51) Int. Cl.
*H01L 21/683* (2006.01)
*H01L 21/677* (2006.01)

(52) U.S. Cl.
CPC .... *H01L 21/6838* (2013.01); *H01L 21/67712* (2013.01)

(58) Field of Classification Search
None
See application file for complete search history.

(56) References Cited

U.S. PATENT DOCUMENTS

| 2006/0046511 | A1* | 3/2006 | Shibata | ................... C30B 25/02 |
| | | | | 438/767 |
| 2014/0212533 | A1* | 7/2014 | Kobrin | .................. G03F 7/0002 |
| | | | | 425/174.4 |
| 2020/0013664 | A1* | 1/2020 | Yamamoto | ........ H01L 21/68785 |

FOREIGN PATENT DOCUMENTS

| KR | 20140112486 A | 9/2014 |
| KR | 20170019415 A | 2/2017 |
| KR | 20170024906 A | 3/2017 |
| KR | 20170026959 A | 3/2017 |
| KR | 100731673 B1 | 6/2017 |
| KR | 101754528 B1 | 6/2017 |
| KR | 101757404 B1 | 7/2017 |

* cited by examiner

*Primary Examiner* — Thien F Tran

(57) ABSTRACT

The present invention relates to a micro LED grip body for vacuum-sucking micro LEDs. More particularly, the present invention relates to a micro LED grip body provided with a mask below a porous member to increase vacuum pressure for vacuum-sucking micro LEDs such that the micro LEDs are transferred without deviation.

6 Claims, 11 Drawing Sheets

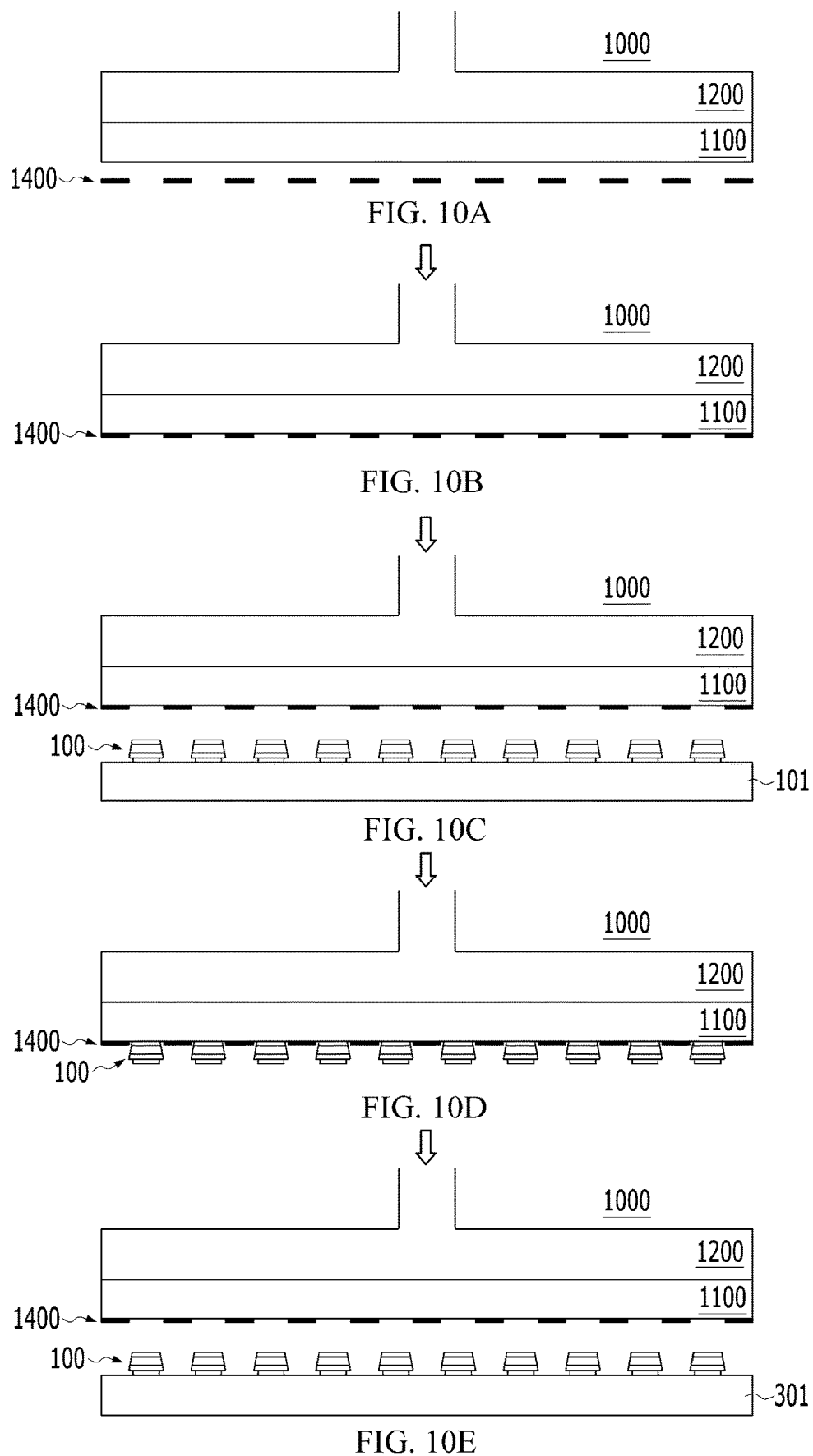

MICRO LED GRIP BODY

CROSS REFERENCE TO RELATED APPLICATION

The present application claims priority to Korean Patent Application No. 10-2018-0056023 filed May 16, 2018, the entire contents of which is incorporated herein for all purposes by this reference.

BACKGROUND OF THE INVENTION

Field of the Invention

The present invention relates to a grip body gripping a micro light-emitting diode (micro LED).

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply the micro LED to a display, it is necessary to develop a customized microchip based on a flexible material and/or flexible device using a micro LED device, and techniques of transferring the micrometer-sized LED chip and mounting the LED chip on a display pixel electrode are required.

Particularly, with regard to the transfer of the micro LED device to a display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). According to the Related Art 3, there is no LED damage problem as compared with the above-mentioned electrostatic head case. However, an adhesive force of the elastic transfer head is required to be higher than that of a target substrate in the transfer process to transfer a micro LED stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and the micro LED may be damaged when pressed with the roller.

Samsung Display Co., Ltd proposed a method of transferring a micro LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6') . However, the Related Art 6 has a problem in that a solution is required since the micro LED is immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that a process of applying a bonding material to the pick-up heads is required because the bonding material having an adhesive force is required to be applied to bonding surfaces of the multiple pick-up heads to transfer the micro LED.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

Documents of Related Art (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention to provide a micro LED grip body provided with a mask below a porous member to increase the vacuum pressure, thereby increasing a grip force for vacuum-sucking micro LEDs and transferring the micro LEDs without deviation of the micro LEDs.

In order to achieve the objective of the present invention, there is provided a micro LED grip body including: a porous member having pores; and a mask provided below the porous member and having an opening.

In addition, the mask may be made of Invar.

In addition, the mask may be made of a metal material.

In addition, the mask may be made of a film material.

In addition, the mask may be made of a paper material.

Furthermore, the mask may be held on the porous member by a vacuum suction force of the porous member.

As described above, a micro LED grip body according to the present invention is provided with a mask such that it is possible to further increase the vacuum pressure for vacuum-sucking micro LEDs through openings of the mask. Thus, the micro LED grip body functions to vacuum-suck the micro LEDs on a lower surface of a porous member having a uniform flatness, thereby preventing the deviation of the micro LEDs, which may occur during vacuum-suction of the micro LEDs.

BRIEF DESCRIPTION OF THE DRAWINGS

The above and other objects, features and other advantages of the present invention will be more clearly understood from the following detailed description when taken in conjunction with the accompanying drawings, in which:

FIGS. 10A to 10E are views illustrating a method of transferring a micro LED using a micro LED grip body according to the embodiment of the present invention.

DETAILED DESCRIPTION OF THE INVENTION

Figure 1:
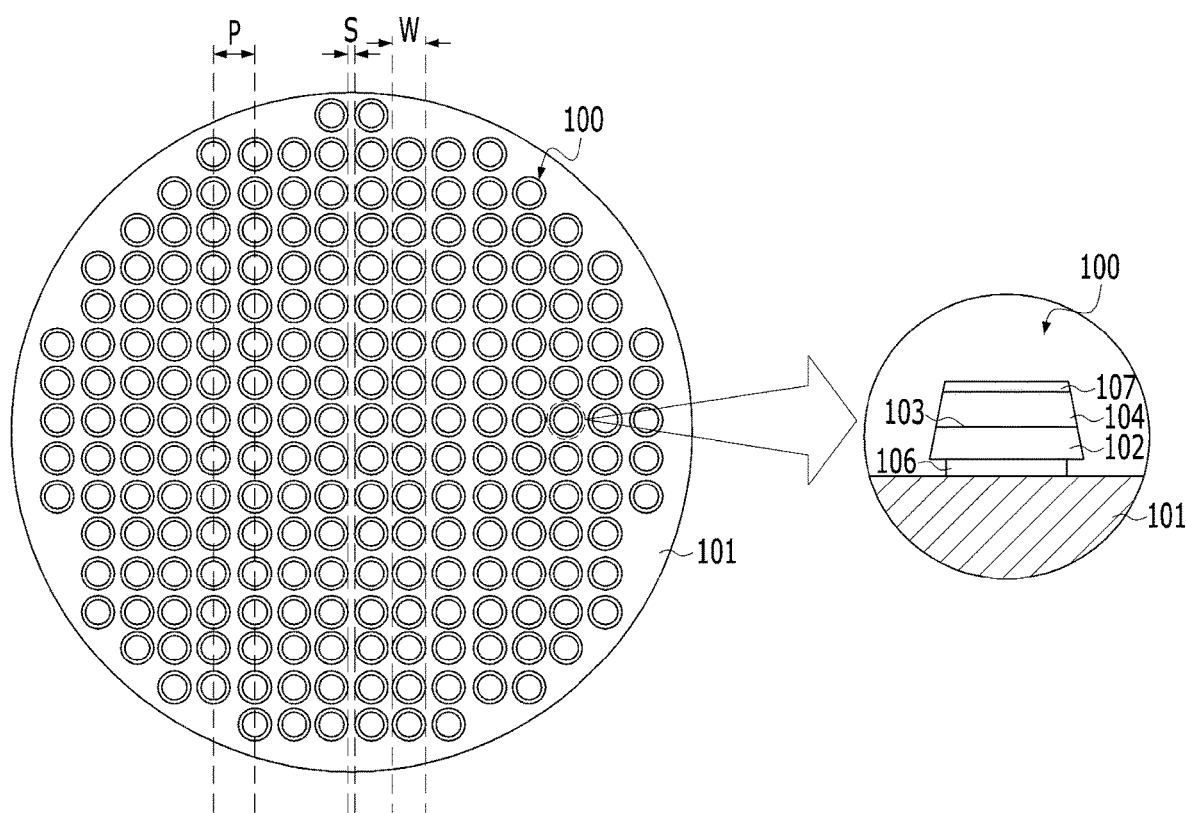
FIG. 1 is a view illustrating micro LEDs to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

FIG. 1 is a view illustrating multiple micro LEDs 100 to be transferred by a transfer head for a micro LED according to an embodiment of the present invention. The micro LEDs 100 are fabricated and disposed on a growth substrate 101.

The growth substrate 101 may be formed into a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \le x \le 1$, $0 \le y \le 1$, $0 \le x+y \le 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be a semiconductor material having a composition formula of $In_xAl_yGa_{1-x-y}N$ ($0 \le x \le 1$, $0 \le y \le 1$, $0 \le x+y \le 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be formed of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

Figure 2:
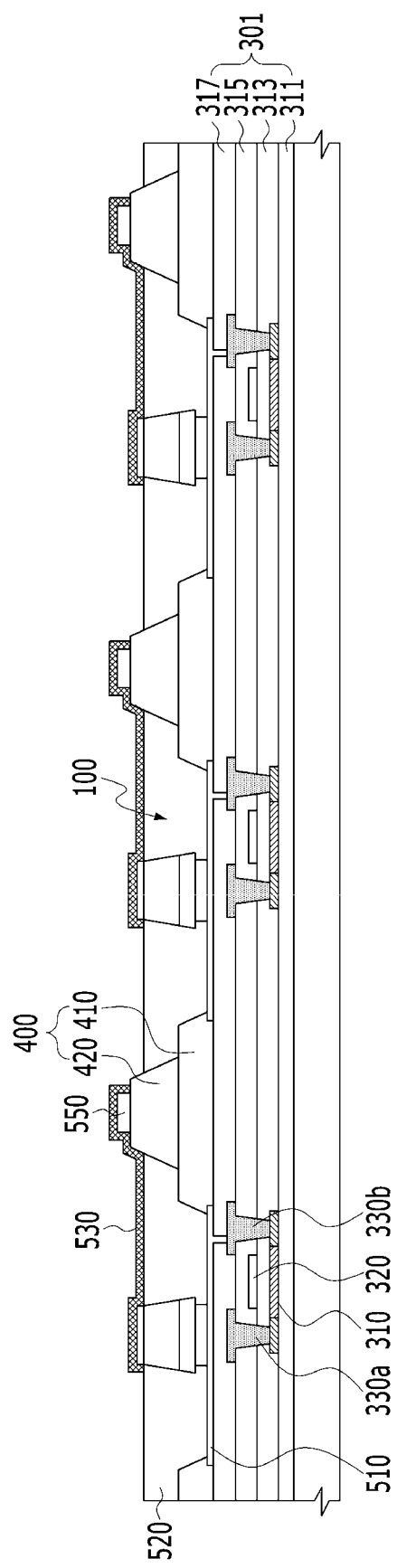
FIG. 2 is a view of a micro LED structure transferred to a display substrate and mounted according to an embodiment of the present invention.

FIG. 2 is a view illustrating a micro LED structure in which the micro LEDs are transferred and mounted to a display substrate by the transfer head for a micro LED according to the embodiment of the present invention.

A display substrate 301 may include various materials. For example, the display substrate 301 may be made of a transparent glass material having $SiO_2$ as a main component. However, materials of the display substrate 301 are not limited to this, and the display substrate 301 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not required to be made of a transparent material. In this case, the display substrate 301 may be made of metal.

In the case of forming the display substrate 301 using metal, the display substrate 301 may be made of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a and the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross-sectional shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 301 such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin, a thermosetting plastic such as epoxy resin, phenolic resin, urethane resin, acrylic resin, vinyl ester resin, polyimide resin, urea resin, and melamine resin, or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride), or the like. In an alternate embodiment, the first bank layer 410 and the second bank layer 420 may be a distributed Bragg reflector (DBR) having high reflectivity or a mirror reflector made of metal.

The micro LED 100 is disposed in the recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the display substrate 301, and received in the recess of the display substrate 301.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

Hereinafter, an embodiment of the invention will be described with reference to FIGS. 3A and 3B.

Figure 3A:
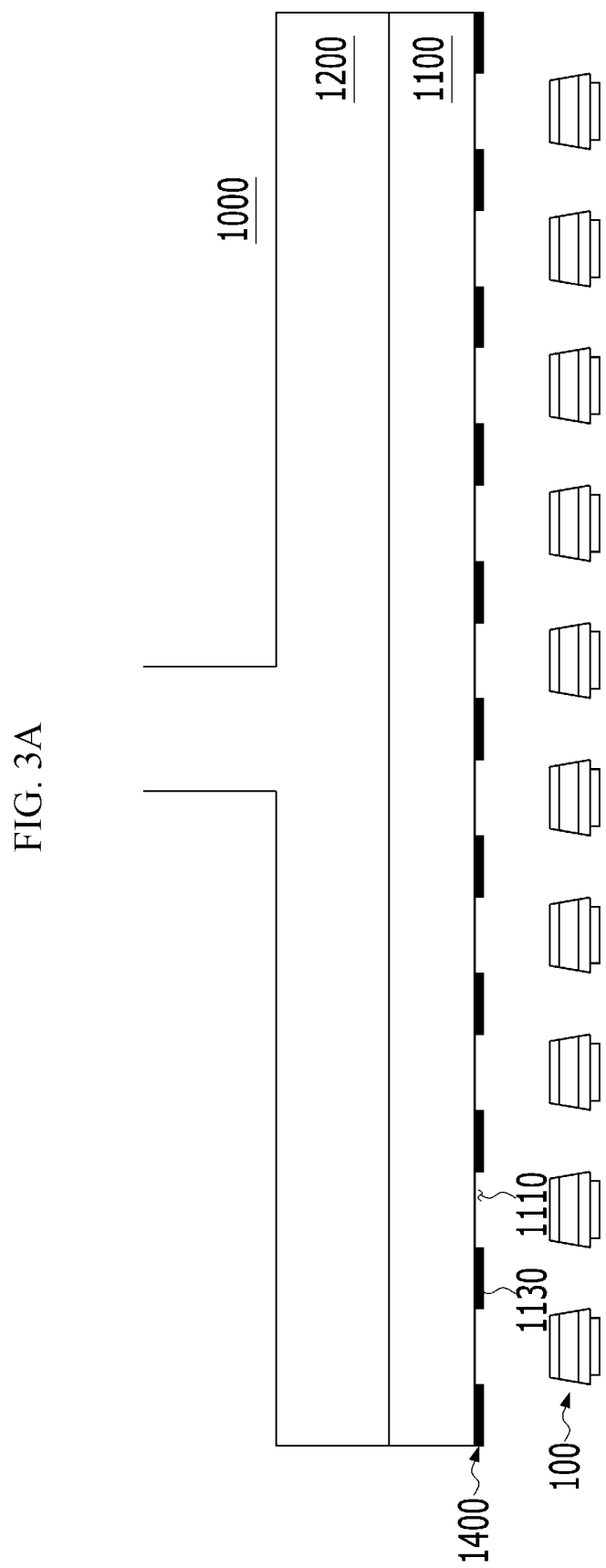
FIG. 3A is a view illustrating a state before a micro LED grip body grips the micro LEDs according to an embodiment of the present invention.
Figure 3B:
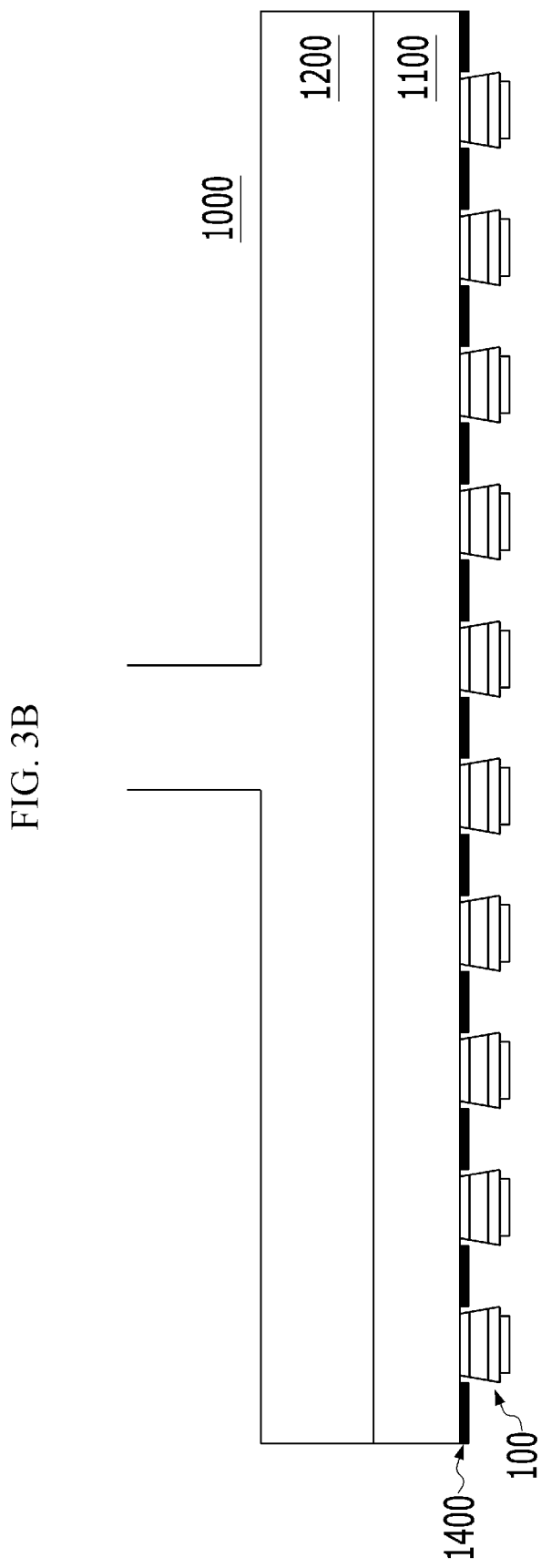
FIG. 3B is a view illustrating a state in which the micro LED grip body grips the micro LEDs according to the embodiment of the present invention.

FIG. 3A is a view illustrating a state before a micro LED grip body 1000 grips the micro LEDs 100 according to the embodiment of the present invention; and FIG. 3B is a view illustrating a state in which the micro LED grip body 1000 grips the micro LEDs 100 according to the embodiment of the present invention. The micro LED grip body 1000 according to the embodiment of the invention includes: a porous member 1100 having pores; and a mask 1400 provided below the porous member 1100 and having openings 1110 such that the micro LEDs 100 are easily gripped on a lower surface of the porous member 1100 through the mask 1400.

A vacuum chamber 1200 is provided on the porous member 1100. The vacuum chamber 1200 is connected to a vacuum port providing vacuum or releasing the vacuum. The vacuum chamber 1200 functions to apply a vacuum to the multiple pores of the porous member 1100 or release the vacuum applied to the pores according to the operation of the vacuum port. A structure of engaging the vacuum chamber 1200 with the porous member 1100 is not limited as long as the structure is suitable for preventing gas or air from leaking to other parts when applying the vacuum to the porous member 1100 or releasing the applied vacuum.

When gripping the micro LEDs 100 with vacuum-suction, the vacuum applied to the vacuum chamber 1200 is transferred to the multiple pores of the porous member 1100 to generate a vacuum suction force for the micro LEDs 100. When detaching the micro LEDs 100, the vacuum applied to the vacuum chamber 1200 is released to remove the vacuum from the multiple pores of the porous member 1100 whereby the vacuum suction force to the micro LEDs 100 is removed.

The porous member 1100 may be composed of a material containing a large number of pores therein, and may be configured as powders, a thin film, a thick film, or a bulk form having a porosity of about 0.2 to 0.95 in a predetermined arrangement or disordered pore structure. The pores of the porous member 1100 are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member 1100 are classified according to constituent components thereof: organic, inorganic (ceramic), metal, and hybrid type. The porous member 1100 includes an anodic oxide film in which pores are formed in a predetermined arrangement. The porous member 1100 is configured as powders, a coating film, or bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member 1100 have a disordered pore structure, the multiple pores are connected to each other inside the porous member 1100 such that air flow paths are formed and connect upper and lower portions of the porous member 1100. When the pores of the porous member 1100 have a vertical pore structure, the inside of the porous member 1100 is pierced from top to bottom by the vertical pores such that air flow paths are formed.

The mask 1400 is provided below the porous member 1100 having the openings 1110 and a non-suction region 1130 on a surface thereof where the openings 1110 are not formed.

Figure 4:
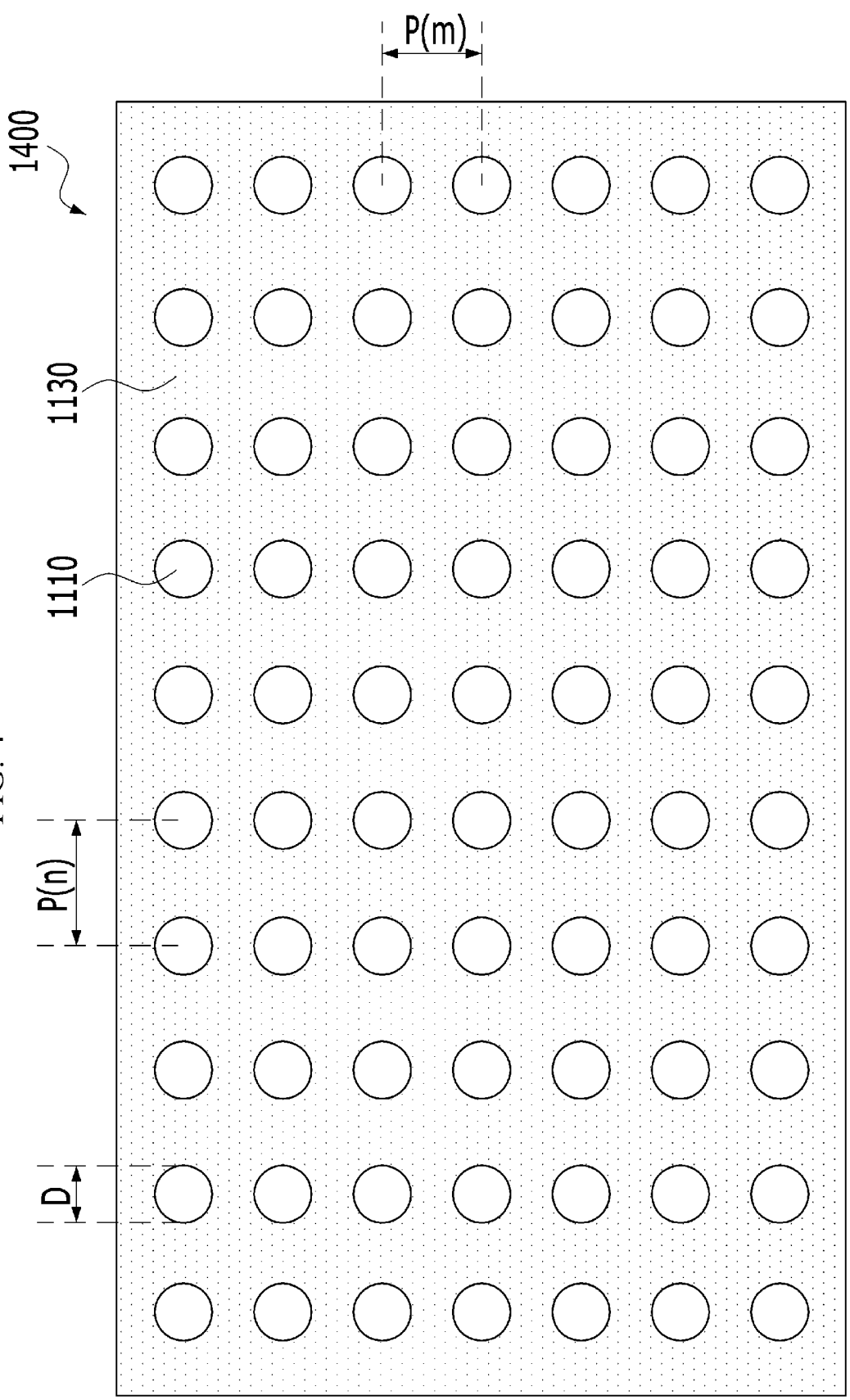
FIGS. 4 to 7 are views illustrating examples of a mask of the embodiment of the present invention.

As illustrated in FIG. 4, the mask 1400 is configured to have the openings 1110 and the non-suction region 1130 on the surface thereof where the openings 1110 are not formed.

In the case where a pitch distance of the micro LEDs 100 on the growth substrate 101 is P(n) in a column direction and a pitch distance of the micro LEDs 100 on the growth substrate 101 in a row direction is P(m), the openings 1110 may be provided with pitch distances equal to the pitch distances of the micro LEDs 100 on the growth substrate 101. In other words, when pitch distances of the micro LEDs 100 on the growth substrate 101 are P(n) in the colum direction and P(m) in the row direction, pitch distances of the openings 1110 of the mask 1400 are P(n) in a column direction and P(m) in a row direction. According to the above configuration, the micro LED grip body 1000 provided with the mask 1400 below the porous member 1100 can vacuum-suck and transfer all of the micro LEDs 100 from the growth substrate 101.

The area of each of the openings 1110 may be configured to be larger than the horizontal area of the upper surface of the micro LED 100. In other words, the diameter of the opening 1110 may be configured to be greater than the horizontal length of the upper surface of the micro LED 100. In the case where the area of the opening 1110 is configured to be larger than the horizontal area of the upper surface of the micro LED 100, the present invention is implemented as the embodiment illustrated in FIGS. 3A and 3B.

As illustrated in FIGS. 3A and 3B, the mask 1400 is provided below the porous member 1100. The mask 1400 is held on the porous member 1100 by the vacuum suction force of the porous member 1100.

FIG. 3A is a view illustrating the state before the micro LED grip body 1000 grips the micro LEDs 100, the micro LED grip body 1000 being provided with the mask 1400 having the openings 1110 in which each area of the openings 1110 is larger than the horizontal area of the upper surface of the micro LED 100. As illustrated in FIG. 3A, the lower surface of the porous member 1100 is configured such that the non-suction region 1130 and the openings 1110 are defined by the shape of the mask 1400.

The non-suction region 1130 of the mask 1400 is a region defined by the mask 1400 having the openings 1110, and therefore has the same thickness as the mask 1400 does such that the non-suction region 1130 is stepped with respect to the openings 1110.

The non-suction region 1130 of the mask 1400 is provided on the porous member 1100 and serves as a shielding portion blocking the pores of the lower surface of the porous member 1100. As a result, the vacuum pressure resulted by transferring the vacuum of the vacuum chamber 1200 to the porous member 1100 can be made larger due to the openings 1110 of the mask 1400. Accordingly, it is possible to effectively grip the micro LEDs 100 on the lower surface of the porous member 1100 through the openings 1110 having the large vacuum pressure.

FIG. 3B is a view illustrating the state in which the micro LED grip body 1000 grips the micro LEDs 100, the micro LED grip body 1000 being provided with the mask 1400 having the openings 1110 in which each area of the openings 1110 is larger than the horizontal area of the upper surface of the micro LED 100. As illustrated in FIG. 3B, the micro LED grip body 1000 is configured such that the non-suction region 1130 of the mask 1400 provided below the porous member 1100 serves as a shielding portion and blocks a part of the lower surface of the porous member 1100. Accordingly, the openings 1110 having the large vacuum pressure serve as a suction region gripping the micro LEDs 100, thereby vacuum-sucking the micro LEDs 100.

As illustrated in FIGS. 3A and 3B, in the case that the mask 1400 having the openings 1110 each having an area larger than the horizontal area of the upper surface of the micro LED 100 is provided on the lower portion of the porous member 1100, the micro LEDs 100 are directly brought into contact with the lower surface of the porous member 1100 having a uniform flatness through the openings of the mask 14000 and vacuum-sucked. Thus, it is possible to prevent the deviation of the micro LEDs 100, which may occur during the vacuum-suction of the micro LEDs 100.

The prevention of the deviation of the micro LEDs 100 can be realized because the vacuum pressure of the porous member 1100 resulted by transferring the vacuum through the vacuum chamber 1200 becomes larger due to the openings 1110 of the mask 1400, whereby the lower surface of the porous member 1100 having the uniform flatness can vacuum-suck the micro LEDs 100 more faithfully.

In addition, in the case that the mask 1400 having the openings 1110 each having an area larger than the horizontal area of the upper surface of the micro LED 100 is provided on the lower portion of the porous member 1100, the micro LED grip body 1000 easily vacuum-sucks the micro LEDs 100 without damage to the micro LEDs 100 which may occur when an outer side of the upper surface of the micro LED 100 is stuck at the stepped portion of the non-suction region 1130 of the mask 1400.

The mask 1400 may be provided to have different pitch distances in the column direction and the row direction.

Figure 5:
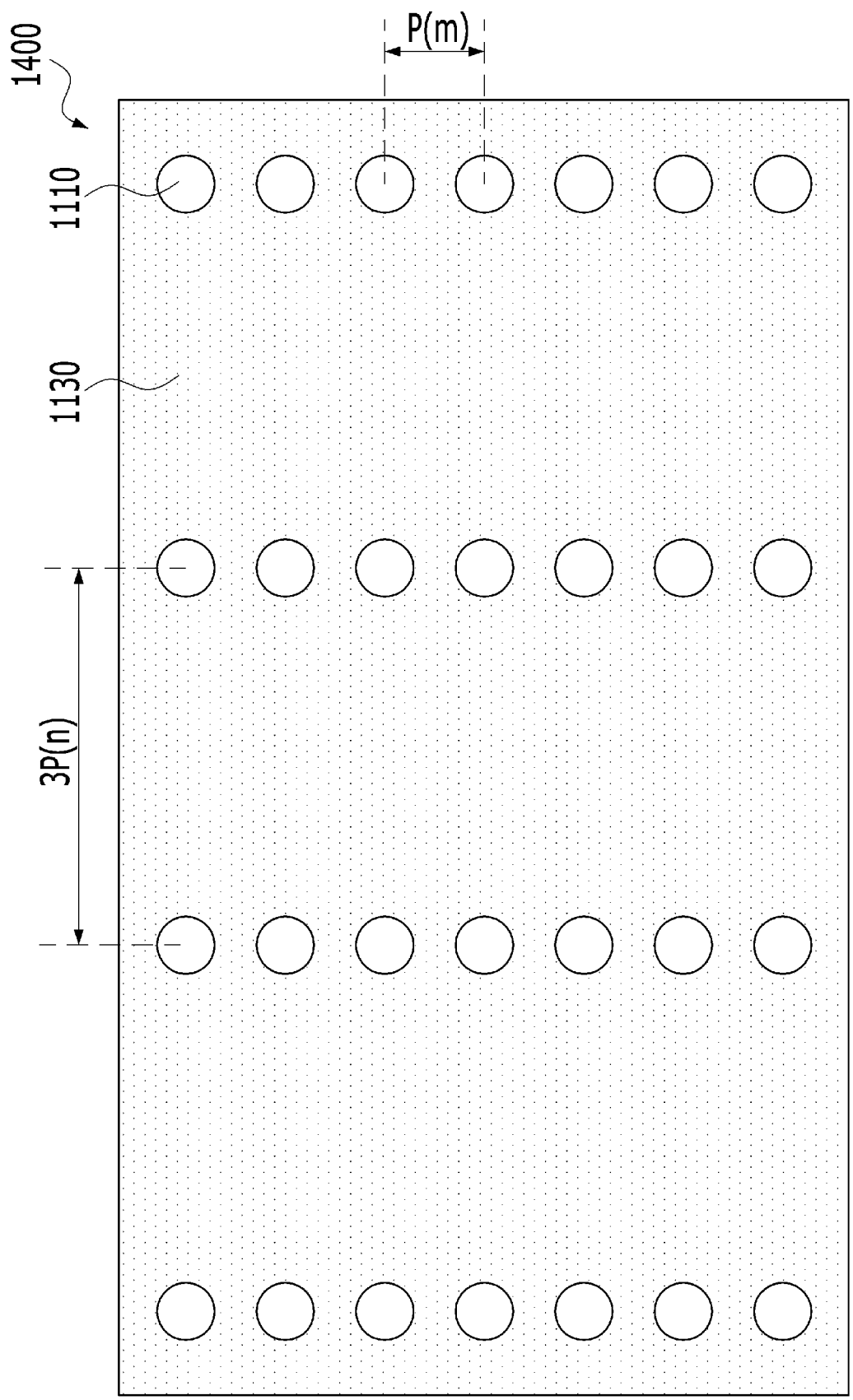
Figure 6:
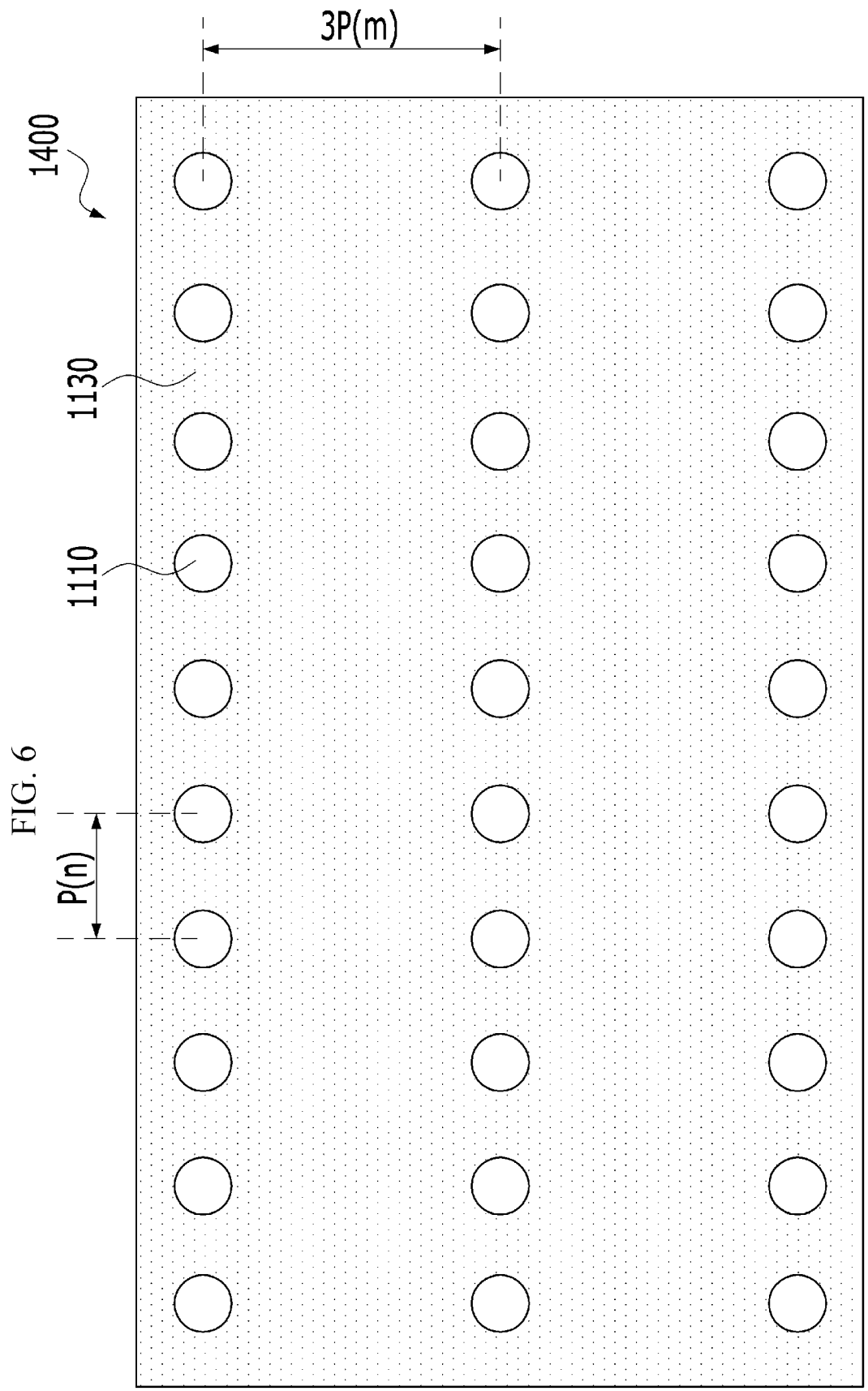
Figure 7:
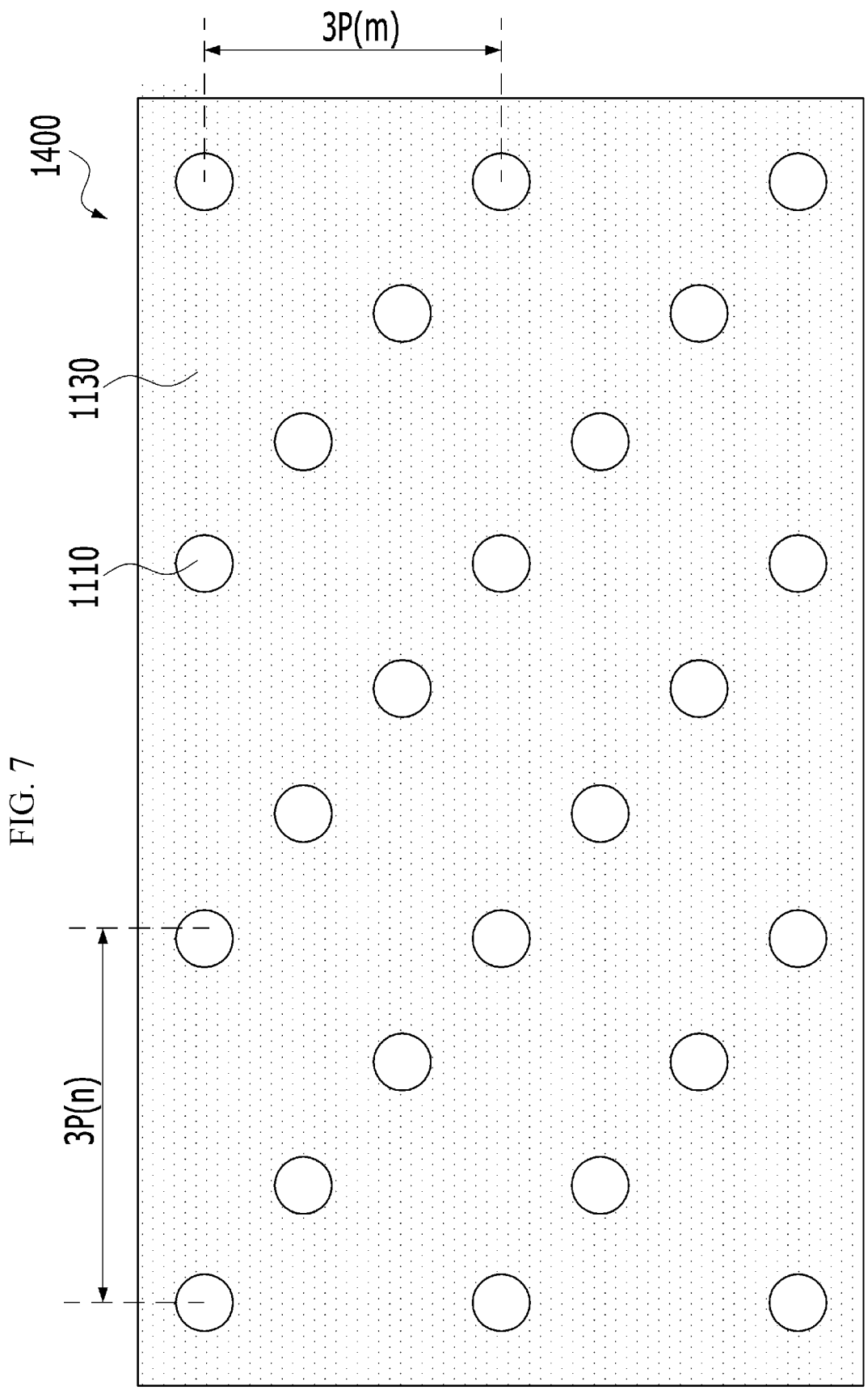

FIGS. 5 to 7 are views illustrating examples of the mask 1400 having different pitch distances in the column direction or in the row direction according to the embodiment of the present invention.

As illustrated in FIG. 5, when pitch distances of the micro LEDs 100 on the growth substrate 101 are P(n) in the column direction and P(m) in the row direction, the mask 1400 may be configured such that the pitch distances of the openings 1110 are 3P(n) in the column direction and P(m) in the row direction. Here, 3P(n) means 3 times the column pitch distance P(n) illustrated in FIG. 4. According to the above configuration, only the micro LEDs 100 at (3n)th columns are vacuum-sucked and transferred. Here, each of the micro LEDs 100 transferred in the (3n)th columns may be any one of red, green, blue, and white LEDs. With such a configuration, it is possible to transfer the micro LEDs 100 of the same luminous color to be mounted on the display substrate 301 such that the micro LEDs 100 are spaced apart from each other with distances of 3P(n).

As illustrated in FIG. 6, when pitch distances of the micro LEDs 100 on the growth substrate 101 are P(n) in the column direction and P(m) in the row direction, the mask 1400 may be configured such that the pitch distances of the openings 1110 are P(n) in the column direction and 3P(m) in the row direction. Here, 3P(m) means 3 times the row pitch distance P(m) illustrated in FIG. 4. According to the above configuration, only the micro LEDs 100 at (3n)th rows are vacuum-sucked and transferred. Here, each of the micro LEDs 100 transferred in the (3n)th rows may be any one of red, green, blue, and white LEDs. With such a configuration, it is possible to transfer the micro LEDs 100 of the same luminous color to be mounted on the display substrate 301 such that the micro LEDs 100 are spaced apart from each other with the distance of 3P(m).

As illustrated in FIG. 7, when pitch distances of the micro LEDs 100 on the growth substrate 101 are P(n) in the column direction and P(m) in the row direction, the openings of the mask 1400 may be configured in a diagonal direction such that the pitch distances of the openings 1110 are 3P(n) in the column direction and 3P(m) in the row direction. Here, each of the micro LEDs 100 transferred in the (3n)th rows and (3n)th columns may be any one of red, green, blue, and white LEDs. According to the above configuration, by arranging the micro LEDs 100 of the same luminous color to be mounted on the display substrate 301 in a manner that the micro LEDs 100 are spaced apart from each other with the distances of 3P(n) and 3P(m), the micro LEDs 100 of the same luminous color are transferred on the display substrate 301 on the diagonal positions.

The mask 1400 may be made of various materials such as Invar, an anodic oxide film, a metal material, a film material, and a paper material.

Invar has a low coefficient of thermal expansion, thereby preventing surface distortion which may occur due to temperature changes. In addition, the anodic oxide film having similar properties to the porous ceramic is also minimally affected by temperature changes. Thus, in the case the mask 1400 is made of an Invar or an anodic oxide film material, it is possible to prevent the surface distortion which may occur due to temperature changes.

The mask 1400 may be made of a metal material. Since the metal material is easy to process, it is possible to form the openings 1110 of the mask 1400 easily. Therefore, in the case the mask 1400 is made of a metal material, the ease of manufacturing can be improved.

In addition, in the case the mask 1400 is made of a metal material, when the metal bonding method is used for bonding the micro LED 100 to the first contact electrode 106 of the display substrate 301, the upper surface of the micro LED 100 is heated by the mask 1400 of the micro LED grip body 1000 without applying power to the display substrate 301 such that the bonding metal (alloy) is heated, and thus the micro LED 100 can be bonded to the first contact electrode 106.

The mask 1400 may be made of a film material. When the micro LED grip body 1000 having the mask 1400 grips the micro LEDs 100, foreign substances may adhere to the surface of the mask 1400. The mask 1400 can be cleaned and reused, but it is troublesome to clean the mask 1400 each time. However, in the case the mask 1400 is made of a film material, it is easy to remove and replace the mask 1400 when the foreign substances adhere to the mask 1400. The mask 1400 may be made of a paper material. Also, when foreign substances adhere to the surface of the mask 1400 made of a paper material, it is easy to remove and replace the mask 1400 without performing a separate cleaning process.

In addition to the Invar, the anodic oxide film, the metal material, the film material, and the paper material, the mask 1400 may be made of an elastic material.

In the case the mask 1400 is made of an elastic material, the mask 1400 serves as a buffer to prevent breakage of the micro LEDs 100. For example, the micro LED grip body 1000 is controlled to descend, leaving only a gap of several to several tens of micrometers on the upper surfaces of the micro LEDs 100. However, when the micro LED grip body 1000 descends to grip the micro LEDs 100, it may be difficult to finely control the descending position. This is because, even when the micro LED grip body 1000 is controlled to descend leaving a gap of several to several tens of micrometers on the upper surfaces of the micro LEDs 100, the micro LED grip body 1000 may slightly further descend with respect to the controlled descending position thereof due to the mechanical tolerance thereof.

When the micro LED grip body 1000 slightly further descends with respect to the controlled descending position, the micro LED grip body 1000 may collide with the micro LEDs 100, leading to damage to the upper surfaces of the micro LEDs 100. However, in the case the mask 1400 provided on the micro LED grip body 1000 is made of an elastic material, it can be said that the mask 1400 serves as a buffer because the mask 1400 can accommodate a transfer error in the direction in which the micro LED grip body 1000 descends.

The mask 1400 may be provided on the micro LED grip body 1000 with different shapes and areas of the openings 1110.

Figure 8:
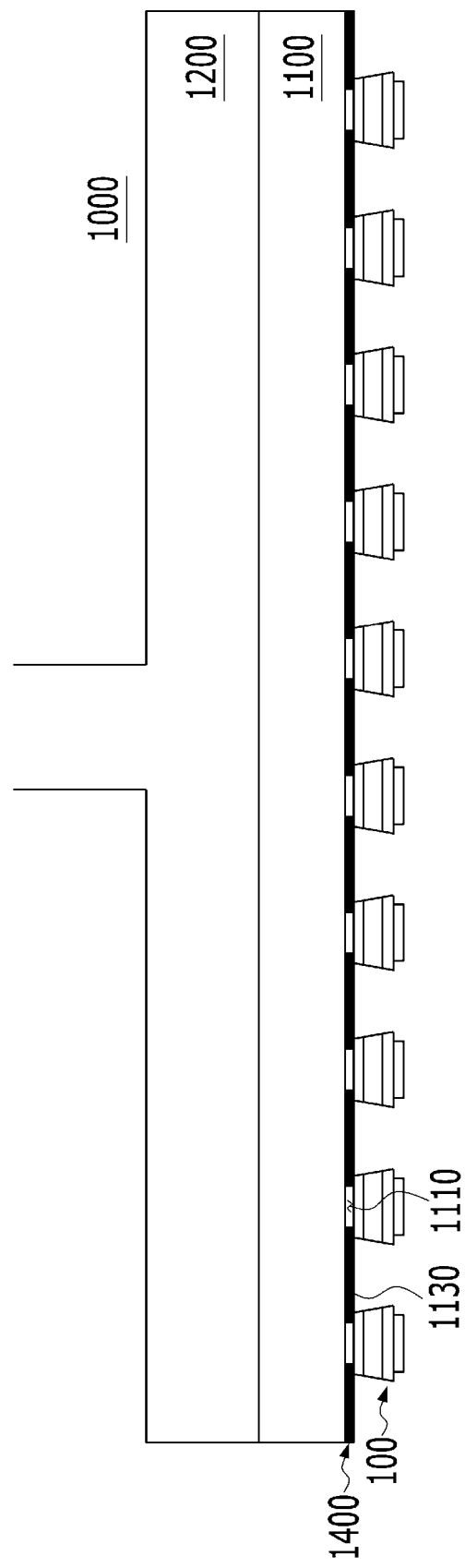
FIG. 8 is a view illustrating a first modification of the embodiment of the embodiment of the invention.
Figure 9:
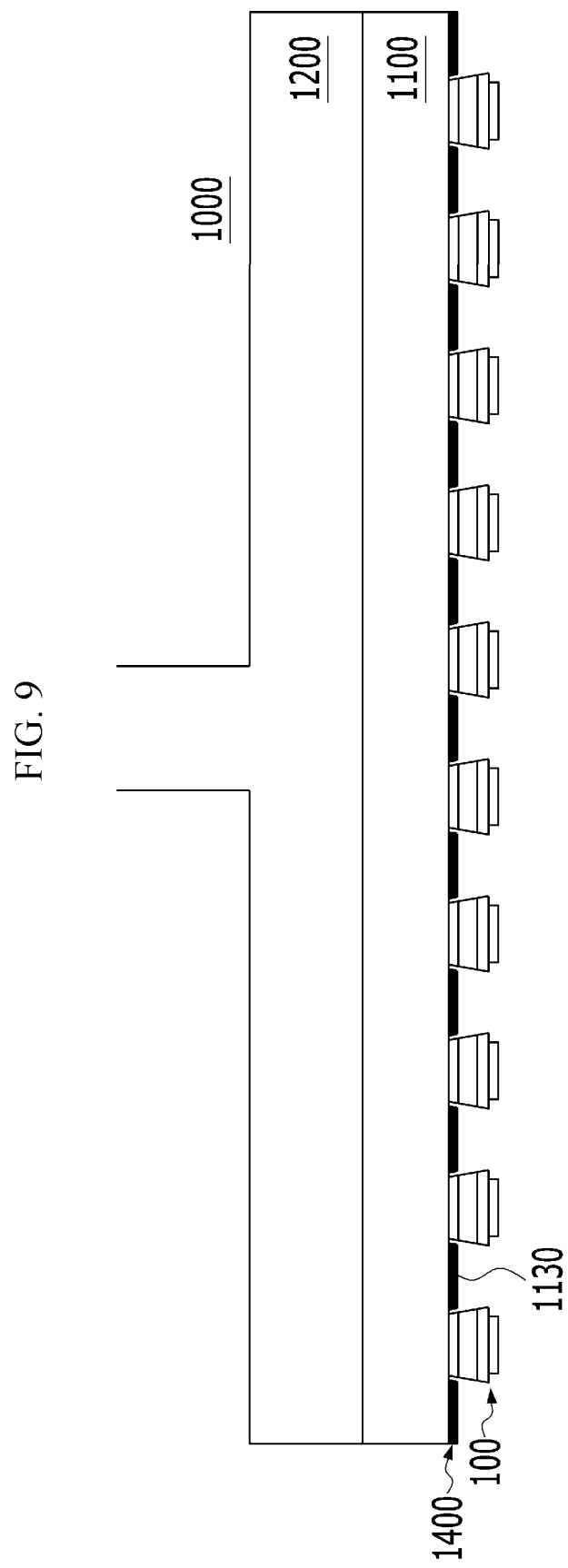
FIG. 9 is a view illustrating a second modification of the embodiment of the embodiment of the invention.

FIGS. 8 and 9 illustrate modifications of the micro LED grip body 1000 illustrated in FIGS. 3A and 3B. The micro LED grip body 1000 illustrated in FIG. 8 is provided with a mask 1400 below the porous member 1100, the mask 1400 having a different area of openings 1110 compared with the mask 1400 of FIG. 4. As illustrated in FIG. 8, the micro LED grip body 1000 is provided with the mask 1400 below the porous member 1100, the mask 1400 having the openings 1110 having the area smaller than the horizontal area of the upper surface of the micro LED 100. The area of the openings 1110 of the mask 1400 is configured to be smaller than the horizontal area of the upper surface of the micro LED 100. In other words, the mask 1400 having the openings 1110 having a diameter (D) smaller than the horizontal length of the upper surface of the micro LED 100 is provided below the porous member 1100. The micro LED grip body 1000 illustrated in FIG. 8 is provided with the mask 1400 having the openings 1110 having the area smaller than the horizontal area of the upper surface of the micro LED 100 such that it is possible to increase the vacuum-suction surface for the micro LEDs 100.

The micro LED grip body 1000 illustrated in FIG. 9 is provided with a mask 1400 below the porous member 1100, the mask 1400 having openings 1110 which have the same area but have a different shape of the openings 1110 compared with the openings 1110 of the mask 1400 of FIG. 4. As illustrated in FIG. 9, the micro LED grip body 1000 is provided with the mask 1400 below the porous member 1100, the mask 1400 being configured such that the inner diameter of the openings 1110 of the mask 1400 that directly comes into contact with the lower surface of the porous member 1100 is configured to be larger than the horizontal length of the upper surface of the micro LED 100 and the inner diameter of the openings 1110 of the mask 1400 gradually increases downwardly such that inner surfaces of the openings 1110 are inclined. The micro LED grip body 1000 illustrated in FIG. 9 is provided with the mask 1400 having the openings 1110 configured such that the inner surface of the openings 1110 are inclined such that the inner diameter of the openings 1110 gradually decreases toward the lower surface of the porous member 1100, and the smallest inner diameter of the openings 1110 is configured to be larger than the horizontal length of the upper surface of the micro LED 100. With a structure including the mask 1400, the micro LED grip body 1000 serves to guide the micro LEDs 100 to the vacuum-suction positions during the vacuum-suction of the micro LEDs 100 such that the micro LEDs 100 are vacuum-sucked on the lower surface of the porous member 1100. Thus, the micro LEDs 100 can be vacuum-sucked at the proper positions.

FIGS. 10A to 10E are views illustrating a method of transferring the micro LEDs 100 using the micro LED grip body 1000 provided with the mask 1400 of FIG. 4 below the porous member 1100 according to the embodiment of the present invention. Although FIGS. 10A to 10E illustrate that the mask 1400 of FIG. 4 is provided, the masks 1400 of FIGS. 5 to 9 may be provided instead.

As illustrated in FIG. 10A, the vacuum applied to the vacuum chamber 1200 is transmitted to the multiple pores such that the porous member 1100 having the vacuum suction force grips the mask 1400 using the vacuum suction force. As illustrated in FIG. 10B, the mask 1400 is held on the porous member 1100 by the vacuum suction force. As illustrated in FIG. 10C, the multiple micro LEDs 100 formed on the growth substrate 101 are prepared to be separable from the growth substrate 101. Thereafter, the micro LED grip body 1000 is moved and positioned above the growth substrate 101, and then descended. The micro LED grip body 1000 obtains the vacuum pressure through the vacuum port and applies the vacuum to the porous member 1100 to vacuum-suck the micro LEDs 100 as illustrated in FIG. 10D. While the micro LED grip body 1000 grips the micro LEDs 100 by the vacuum suction force, the porous member 1100 of the micro LED grip body 1000 may be brought into close contact with the micro LEDs 100. Thereafter, the micro LED grip body 1000 is moved and positioned above the display substrate 301, and then descended. Although not illustrated in the drawings, the mask 1400 and the micro LEDs 100 vacuum-sucked on the lower surface of the porous member 1100 are transferred to the display substrate 301 by releasing the vacuum applied to the porous member 1100 through the vacuum port. Subsequently, each of the micro LEDs 100 transferred to the display substrate 301 may be bonded to the first contact electrode 106 of the display substrate 301 by applying power to the display substrate 301. Thereafter, as illustrated in FIG. 10E, the micro LED grip body 1000 obtains the vacuum pressure through the vacuum port and applies the vacuum to the porous member 1100 to retrieve the mask 1400 transferred to the display substrate 301. Since each of the micro LEDs 100 is bonded to the first contact electrode 106, only the mask 1400 is vacuum-sucked on the lower surface of the porous member 1100. Although the present invention illustrates that the mask 1400 transferred to the display substrate 301 is retrieved and removed by the micro LED grip body 1000, the mask 1400 may be removed by other suitable means.

Also, although not illustrated in the drawings, the micro LED grip body 1000 vacuum-sucking the micro LEDs 100 as illustrated in FIG. 10D may be moved and positioned above the display substrate 301 and then descended. The descended micro LED grip body 1000 heats the upper surfaces of the vacuum-sucked micro LEDs 100 through the mask 1400 while pressing the upper surfaces of the micro LEDs 100 and bonds the micro LEDs 100. After bonding the micro LEDs 100, the micro LED grip body 1000 is lifted up with the mask 1400 vacuum-sucked on the lower surface of the porous member 1100 as illustrated in FIG. 10E, and thus the transfer of only the micro LEDs 100 is completed.

The micro LED grip body 1000 of the present invention is provided with the mask 1400 as described above whereby it is possible to further increase the vacuum pressure for vacuum-sucking the micro LEDs 100 through the openings 1110 of the mask 1400. In addition, with the large vacuum pressure, the micro LEDs 100 are directly brought into contact with the lower surface of the porous member 1100 having a uniform flatness, thereby preventing the deviation of the micro LEDs 100, which may occur during the vacuum suction of the micro LEDs 100.

As described above, the present invention has been described with reference to the embodiments. However, those skilled in the art will appreciate that various modifications, additions and substitutions are possible, without departing from the scope and spirit of the invention as disclosed in the accompanying claims.

What is claimed:
1. A micro LED grip body, comprising:
   a porous member having pores; and a mask provided below the porous member and having an opening.

2. The micro LED grip body of claim 1, wherein the mask is made of Invar.

3. The micro LED grip body of claim 1, wherein the mask is made of a metal material.

4. The micro LED grip body of claim 1, wherein the mask is made of a film material.

5. The micro LED grip body of claim 1, wherein the mask is made of a paper material.

6. The micro LED grip body of claim 1, wherein the mask is held on the porous member by a vacuum suction force of the porous member.

\* \* \* \* \*